United States Patent
Ye et al.

(10) Patent No.: US 11,342,399 B2
(45) Date of Patent: May 24, 2022

(54) ARRAY SUBSTRATE, DRIVING METHOD THEREOF, FABRICATION METHOD THEREOF, AND DISPLAY APPARATUS

(71) Applicants: HEFEI BOE OPTOELECTRONICS TECHNOLOGY CO., LTD., Anhui (CN); BOE Technology Group Co., Ltd., Beijing (CN)

(72) Inventors: Zhijie Ye, Beijing (CN); Wenbin Jia, Beijing (CN); Xinxin Wang, Beijing (CN); Rui Peng, Beijing (CN); Yikun Dou, Beijing (CN); Yue Hu, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 510 days.

(21) Appl. No.: 16/333,725

(22) PCT Filed: Jul. 3, 2018

(86) PCT No.: PCT/CN2018/094304
§ 371 (c)(1),
(2) Date: Mar. 15, 2019

(87) PCT Pub. No.: WO2019/114260
PCT Pub. Date: Jun. 20, 2019

(65) Prior Publication Data
US 2021/0359023 A1 Nov. 18, 2021

(30) Foreign Application Priority Data
Dec. 15, 2017 (CN) .......................... 201711352365.0

(51) Int. Cl.
*H01L 29/08* (2006.01)
*H01L 27/32* (2006.01)
(Continued)

(52) U.S. Cl.
CPC .......... *H01L 27/326* (2013.01); *G06K 9/0004* (2013.01); *H01L 27/3227* (2013.01); *H01L 51/5036* (2013.01); *H01L 2227/323* (2013.01)

(58) Field of Classification Search
CPC ............... H01L 27/3227; H01L 27/323; H01L 27/3234; H01L 27/3246; H01L 27/3326;
(Continued)

(56) References Cited

U.S. PATENT DOCUMENTS

| | | | |
|---|---|---|---|
| 2017/0255809 A1 | 9/2017 | Huang et al. | |
| 2017/0270342 A1 | 9/2017 | He et al. | |
| 2018/0040675 A1* | 2/2018 | Zeng | H01L 27/3246 |
| 2018/0129852 A1* | 5/2018 | Zeng | H01L 27/3253 |
| 2019/0034686 A1 | 1/2019 | Ling et al. | |

FOREIGN PATENT DOCUMENTS

| | | |
|---|---|---|
| CN | 106940488 A | 7/2017 |
| CN | 106981503 A | 7/2017 |

(Continued)

OTHER PUBLICATIONS

Office Action dated Jul. 30, 2020, issued in counterpart CN application No. 201711352365.0, with English translation (27 pages).
(Continued)

*Primary Examiner* — Brook Kebede
(74) *Attorney, Agent, or Firm* — WHDA, LLP (57) ABSTRACT

An array substrate may include a dielectric layer (1), a plurality of pixel units (2) on the dielectric layer (1), auxiliary light emitting elements (3), and a fingerprint recognition layer (4) on a side of the dielectric layer (1) opposite from the pixel units (2). Each of the pixel units (2) may comprise transparent display elements (21). The fingerprint recognition layer (4) may comprise fingerprint
(Continued)

recognition elements (41). The fingerprint recognition elements (41) may be configured to receive light emitted by the auxiliary light emitting elements (3) and reflected by a touch control body (10) to identify fingerprint information.

20 Claims, 4 Drawing Sheets

(51) Int. Cl.
    *G06K 9/00*     (2022.01)
    *H01L 51/50*     (2006.01)

(58) Field of Classification Search
    CPC ............. H01L 51/5036; H01L 51/5203; H01L 51/5237; G06F 3/0412; G06F 3/0416; G06F 3/0421; G06K 9/0002; G06K 9/0004; G06K 9/00053; G06K 9/0008
    USPC .......................................................... 257/40
    See application file for complete search history.

(56) References Cited

FOREIGN PATENT DOCUMENTS

| | | | |
|---|---|---|---|
| CN | 107122742 | A | 9/2017 |
| CN | 107238961 | A | 10/2017 |
| CN | 107247922 | A | 10/2017 |
| CN | 107275376 | A | 10/2017 |
| WO | 2017/166581 | A1 | 10/2017 |
| WO | 2017/202075 | A1 | 11/2017 |

OTHER PUBLICATIONS

International Search Report dated Sep. 27, 2018, issued in counterpart Application No. PCT/CN2018/094304 (10 pages).

Extended (Supplementary)European Search Report dated Aug. 18, 2021, issued in counterpart EP Application No. 18857404.0. (10 pages).

* cited by examiner

ARRAY SUBSTRATE, DRIVING METHOD THEREOF, FABRICATION METHOD THEREOF, AND DISPLAY APPARATUS

CROSS-REFERENCE TO RELATED APPLICATIONS

This application claims benefit of the filing date of Chinese Patent Application No. 201711352365.0 filed on Dec. 15, 2017, the disclosure of which is hereby incorporated in its entirety by reference.

TECHNICAL FIELD

This invention relates to a display technology, and more particularly, to an array substrate, a driving method thereof, a fabrication method thereof, and a display apparatus.

BACKGROUND

Fingerprints are characteristics of a human body that are innate, unique and distinguishable from others. A fingerprint is composed of a series of ridges and valleys on a skin surface of a fingertip. These ridges and valleys generally contain details such as ridge bifurcations, ridge ends, arches, tented arches, left-handed spirals, right-handed spirals, double spirals or the like, which determine the uniqueness of a fingerprint pattern. Fingerprint recognition technologies based on these details have been widely used to verify personal identities. Based on ways of acquisition and input of fingerprints, the currently widely used and best known fingerprint recognition technologies include optical imaging, thermal sensor, and infrared sensor, etc.

BRIEF SUMMARY

Accordingly, one example of the present disclosure is an array substrate. The array substrate may include a dielectric layer, a plurality of pixel units on the dielectric layer, auxiliary light emitting elements among at least some of the transparent display elements, and a fingerprint recognition layer on a side of the dielectric layer opposite from the pixel units. Each of the pixel units may include the transparent display elements. The fingerprint recognition layer may include fingerprint recognition elements. The fingerprint recognition elements may be configured to receive light emitted by the auxiliary light emitting elements and reflected by a touch control body to identify fingerprint information.

The plurality of pixel units and the auxiliary light emitting elements may be on a same side of the dielectric layer. In one embodiment, an orthographic projection of at least one of the fingerprint recognition elements on the dielectric layer may overlap an orthographic projection of at least one of the transparent display elements on the dielectric layer. Orthographic projections of the auxiliary light emitting elements and the fingerprint recognition elements are present on the dielectric layer and do not overlap. In another embodiment, orthographic projections of the auxiliary light emitting elements and the fingerprint recognition elements are present on the dielectric layer and do not completely overlap.

Each of the auxiliary light emitting elements may include a first electrode, a light emitting layer, and a second electrode arranged sequentially along a direction away from the dielectric layer, and the first electrode may include a reflecting material. The plurality of pixel units may be arranged in an array mode, and one of the auxiliary light emitting elements may be arranged between every two adjacent pixel units in a row direction. The pixel units and the fingerprint recognition elements may be arranged in a one-to-one correspondence mode.

Each of the auxiliary light emitting elements may include white electroluminescent element emitting white light. The transparent display elements may include electroluminescent elements emitting light of a red, green or blue color respectively or a mixed of any two of red, green and blue colors. Each of the fingerprint recognition elements may include a photodiode. The dielectric layer may include a glass base.

The array substrate may further include an interlayer insulating layer and a reflection layer. The reflection layer may be on a side of the fingerprint recognition layer opposite from the dielectric layer, and the interlayer insulating layer may be between the reflection layer and the fingerprint recognition layer.

Another example of the present disclosure is a method of driving the array substrate. The method of driving the array substrate may include a fingerprint recognition stage. The method may include a step of controlling the fingerprint recognition elements in the fingerprint recognition layer to receive the light emitted by the auxiliary light emitting elements and reflected by the touch control body to identify fingerprint information. In the fingerprint recognition stage, the transparent display elements may be turned off.

The method of driving the array substrate may further include a display stage. The method may include controlling all transparent display elements in the pixel units and the auxiliary light emitting elements to emit light to realize image display.

Another example of the present disclosure is a method of fabricating an array substrate. The method of fabricating an array substrate may include forming a plurality of pixel units on a dielectric layer, forming auxiliary light emitting elements among at least some of the pixel units, and forming a fingerprint recognition layer on a side of the dielectric layer opposite from the pixel units. Each of the pixel units may include transparent display elements. Forming the fingerprint recognition layer may include forming fingerprint recognition elements, and the fingerprint recognition elements may be configured to identify fingerprint information based on received light emitted by the auxiliary light emitting elements and reflected by a touch control body.

The method of fabricating an array substrate may further include forming an interlayer insulating layer and a reflection layer sequentially on a side of the fingerprint recognition layer opposite from the dielectric layer. Orthographic projections of the auxiliary light emitting elements and the fingerprint recognition elements may be present on the dielectric layer and do not overlap.

Another example of the present disclosure is a display apparatus. The display apparatus may include an array substrate according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-4. When referring to the figures, like structures and elements shown throughout are indicated with like reference numerals. The described embodiments are part of the embodiments of the present disclosure, and are not all embodiments. According to the embodiments of the present disclosure, all other embodiments obtained by persons of ordinary skill in the art without creative efforts, belong to the protective scope of the disclosure.

In the description of the present disclosure, the terms "first" and "second" may be used for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

At present, optical fingerprint recognition sensors realize their detection and recognition function by detecting and identifying light reflected from fingers of a person. In order to realize fingerprint recognition in a display region of an electronic apparatus, the optical fingerprint recognition sensors need to be located in non-display regions among pixel units in the display region. In order to ensure a certain pixel/aperture ratio, the regions for the optical fingerprint recognition sensors are very limited. Thus, the optical fingerprint recognition sensors usually have a small surface area. As a result, the surface areas of the optical fingerprint recognition sensors for light absorption are small and the photocurrents generated accordingly are low, thereby easily causing errors in the detection and recognition of the fingerprints.

Embodiment 1

Figure 1:
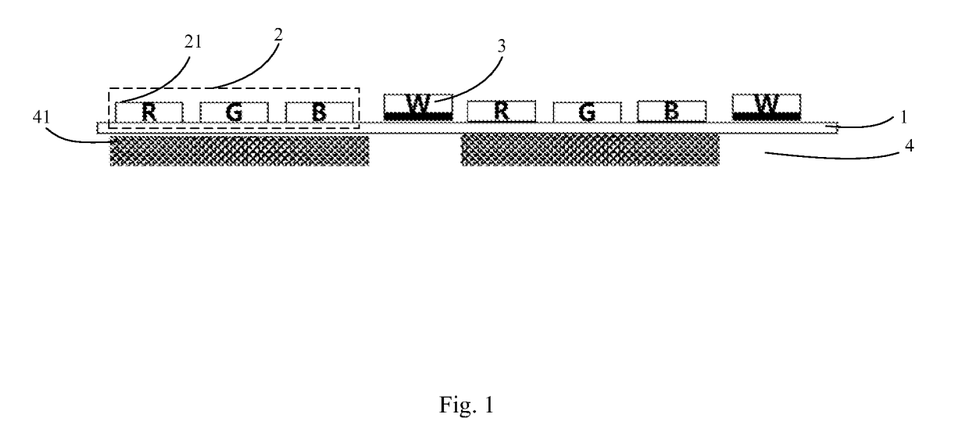
FIG. 1 is a schematic structural diagram of an array substrate according to an embodiment of the present disclosure.
Figure 2:
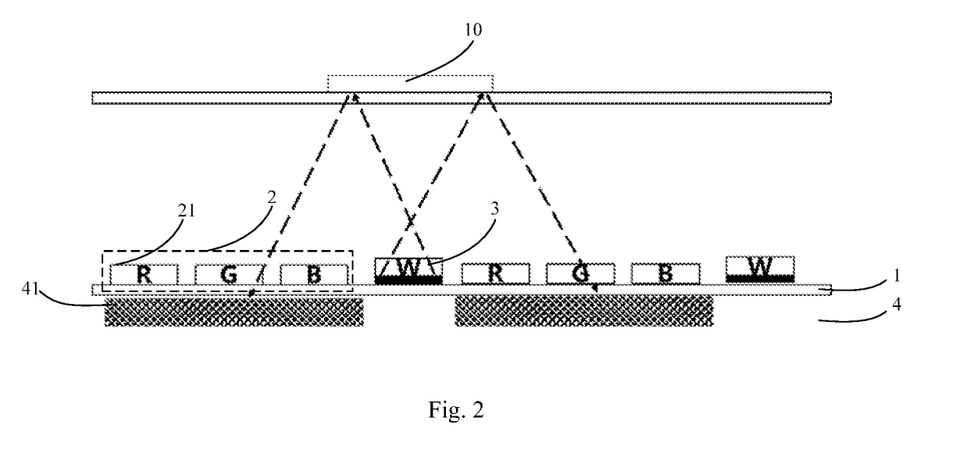
FIG. 2 is a light diagram of an array substrate in a fingerprint recognition stage according to an embodiment of the present disclosure.
Figure 3A:
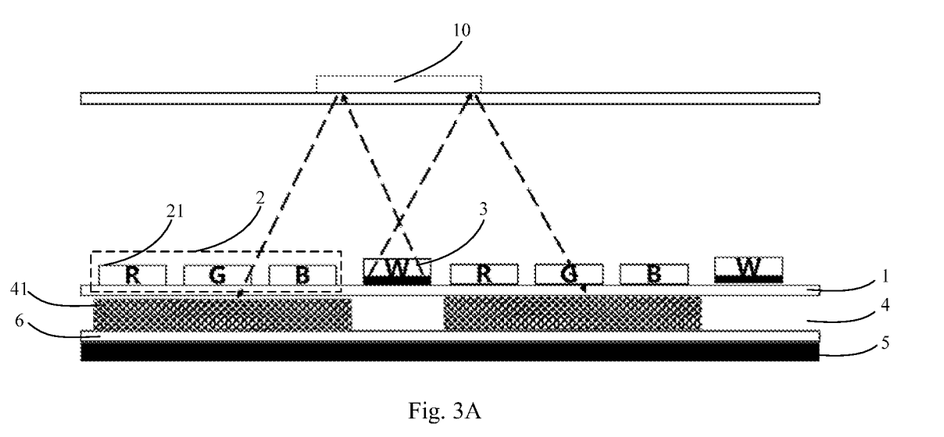
FIG. 3A is a light diagram of an array substrate in a fingerprint recognition stage according to an embodiment of the present disclosure.
Figure 3B:
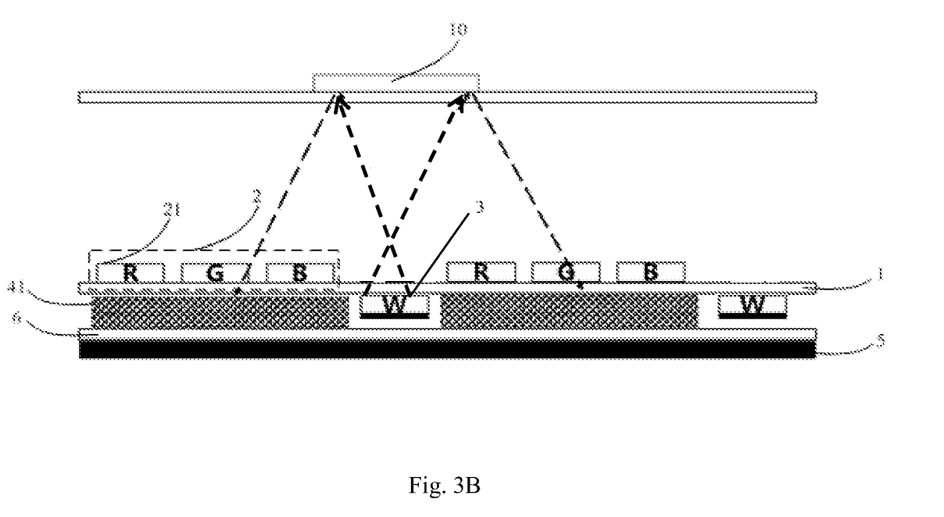
FIG. 3B is a light diagram of an array substrate in a fingerprint recognition stage according to an embodiment of the present disclosure.

An array substrate is provided according to one embodiment of the present disclosure. FIG. 1 is a schematic structural diagram of an array substrate according to an embodiment of the present disclosure. FIG. 2 is a light diagram of an array substrate in a fingerprint recognition stage according to an embodiment of the present disclosure. As shown in FIGS. 1 and 2, the array substrate includes a dielectric layer 1, a plurality of pixel units 2, auxiliary light emitting elements 3, a fingerprint recognition layer 4, and a reflection layer 5. The plurality of pixel units 2 is located on the dielectric layer 1. Each of the plurality of the pixel units 2 includes transparent display elements 21. The auxiliary light emitting elements 3 are located among at least some of the plurality of the pixel units 2 or at least some of the transparent display elements. The fingerprint recognition layer 4 includes fingerprint recognition elements 41 and is located on a surface of the dielectric layer 1 opposite from the plurality of pixel units 2. In the fingerprint recognition stage, the fingerprint recognition elements 41 in the fingerprint recognition layer 4 identify fingerprint information based on the light emitted by the auxiliary light emitting element 3 and then reflected by a touch control body 10 to the fingerprint recognition layer 4. In the display stage, the transparent display elements 21 in the plurality of the pixel units 2 and the auxiliary light emitting elements can simultaneously emit light to realize display. The auxiliary light emitting elements 3 may be on the same side of the dielectric layer 1 as the pixel units 2, as shown in FIG. 3A. In another embodiment, the auxiliary light emitting elements 3 may be on the same side of the dielectric layer 1 as the fingerprint recognition elements 41, as shown in FIG. 3B.

In one embodiment, the so-called "touch control body" herein refers to a touch main body having valleys and ridges on its surface such as fingers, toes and the like. In order to increase the pixel aperture ratio, the fingerprint recognition elements 41 in the fingerprint recognition layer 4 at least partially overlap the pixel units 2. The selected fingerprint recognition elements 41 are at positions corresponding to the pixel units 2 and allow the light emitted by the pixel units 2 to pass through the positions where the fingerprint recognition elements are located. For example, the fingerprint recognition element 41 in the fingerprint recognition layer 4 generally includes a photodiode. The photodiode can be made into a transparent element.

In the array substrate of the present embodiment, the display elements in the pixel units 2 are transparent display elements 21. Therefore, in the fingerprint recognition stage, the fingerprint recognition elements 41 are turned on. Light emitted by the auxiliary light emitting elements 3 located among the pixel units 2 is reflected by the touch control body 10, passes through the transparent display elements 21, and irradiates the fingerprint recognition elements 41. Because the amount of light reflected by the valleys and the ridges of the touch control body 10 is different, the corresponding fingerprint recognition elements 41 receive different amounts of light. As a result, the corresponding fingerprint recognition elements 41 generate different amount of photocurrents and accordantly the fingerprint recognition is realized. Meanwhile, the fingerprint recognition layer 4 in the array substrate of the present embodiment is located at a side of the dielectric layer 1 opposite from the pixel units 2. In other words, the aperture ratio of the pixel units is not affected. As such, the area of each fingerprint recognition element 41 in the fingerprint recognition layer 4 according to one embodiment of the present disclosure can be manufactured larger than that of the existing fingerprint recognition element 41. That is, the area for light absorption is increased, and accordingly the photocurrent generated is also increased. As a result, the fingerprint detection and recognition are more accurate.

The dielectric layer 1 in the embodiment may be a base or an insulating layer. In one embodiment, the dielectric layer 1 is a glass base. The fingerprint recognition layer 4 and the pixel units 2 are arranged on two opposite sides of the glass base respectively. That is, the fingerprint recognition layer 4 and the pixel units 2 are located at different sides of the glass base respectively. In another embodiment, when the dielectric layer 1 is an insulating layer, the dielectric layer 1 is arranged on the glass base. The fingerprint recognition layer 4 and the pixel units 2 are located at a same side of the glass base.

In one embodiment, in order to improve the display effect of the array substrate, as shown in FIG. 3A, a reflection layer 5 is arranged on a side of the fingerprint recognition layer 4 opposite from the dielectric layer 1. An interlayer insulation layer 6 is arranged between the fingerprint recognition layer 4 and the reflection layer 5. As such, in the display stage, the light emitted by the transparent display elements 21 in the pixel units 2 passes through the fingerprint recognition layer 4 to vertically irradiate the reflection layer 5 and is then reflected out to realize display. As such, the loss of light is prevented, and the display effect can be improved. Furthermore, the fingerprint recognition layer 4 and the reflection layer 5 are insulated from each other, thereby preventing short-circuiting of the fingerprint recognition layer 4 and the reflection layer 5.

In one embodiment, a color of the light emitted by the auxiliary light emitting elements 3 is different from colors of the light emitted by the transparent display elements 21 in the pixel units 2. For example, each of the pixel units 2 includes electroluminescent elements emitting light of one of three colors of red, green and blue (R, G and B) respectively or a mixed color of any two of the three colors. In one embodiment, the transparent display element 21 is an organic electroluminescent element. The auxiliary light emitting element 3 is a white organic electroluminescent element W emitting white light. During the display, the white organic electroluminescent element may serve as a pixel in the adjacent pixel unit 2. That is, each pixel unit 2 may include organic electroluminescent elements emitting light of four colors: red, green, blue, and white (that is, R, G, B and W), thereby increasing the display brightness of the display panel. In other embodiments, the auxiliary light emitting element 3 may also be an organic electroluminescent element emitting light of yellow color or red wine color, thereby increasing the gamut of the display color of the display panel. In the display phase, W can also be used as a display pixel and displayed together with RGB.

In the fingerprint recognition stage, the auxiliary light emitting elements 3 are used for lighting the fingerprint recognition elements 41 so that the fingerprint recognition elements 41 can identify a fingerprint. The more the touch control body 10 reflects the light emitted by the auxiliary light emitting elements 3 to the fingerprint recognition elements 41, the more photocurrents the fingerprint recognition elements 41 can induce, which is conducive to the fingerprint recognition. Thus, in one embodiment, the auxiliary light emitting element 3 is a top-emitting display element. That is, the auxiliary light emitting element 3 includes a first electrode, a light emitting layer, and a second electrode which are sequentially arranged along the direction away from the dielectric layer 1. The first electrode may be composed of a reflecting material. As such, the direction of the exiting light of the auxiliary light emitting elements 3 in the fingerprint recognition stage is directed to the touch control body 10.

In one embodiment, in the array substrate, a plurality of pixel units is arranged in an array mode. An auxiliary light emitting element 3 is arranged between every two adjacent pixel units 2 in a row direction. Meanwhile, a fingerprint recognition element 41 is provided at each of the positions in the fingerprint recognition layer 4 corresponding to the pixel units 2. That is, the pixel units 2 and the fingerprint recognition elements 41 are arranged in a one-to-one correspondence. As such, full-screen fingerprint recognition can be realized, and accurateness of the fingerprint recognition is also improved.

In one embodiment, the orthographic projections of the auxiliary light emitting elements 3 and the fingerprint recognition elements 41 on the dielectric layer 1 do not overlap. In the fingerprint recognition stage, the light emitted by the auxiliary light emitting elements 3 and reflected by the touch control body 10 irradiates the fingerprint recognition elements 41 at a certain angle. The orthographic projections of the auxiliary light emitting elements 3 and the fingerprint recognition elements 41 on the dielectric layer 1 do not overlap to ensure the light emitted by the auxiliary light emitting element 3 to completely shine on the fingerprint recognition elements 41 through the touch control body 10, thereby achieving accurate fingerprint recognition. In another embodiment, it is ok as long as the orthographic projections of the auxiliary light emitting elements 3 and the fingerprint recognition elements 41 on the dielectric layer 1 do not completely overlap. That is, the orthographic projections of the auxiliary light emitting elements 3 and the fingerprint recognition elements 41 on the dielectric layer 1 may partly overlap.

Embodiment 2

A driving method of an array substrate is provided according to one embodiment of the present disclosure. The array substrate may be the array substrate in Embodiment 1.

In one embodiment, each of the pixel units 2 in the array substrate is electrically connected correspondingly with a data line and a gate line. When a gate line is enabled, a data voltage loaded on the data line is written into the pixel units 2 to realize display of a corresponding gray scale. The display principle of the auxiliary light emitting elements 3 is the same as that of the pixel units 2. Each fingerprint recognition element 41 is electrically connected correspondingly with a drive line and a read line. When the drive line is enabled, the fingerprint recognition element 41 converts the amount of light received into a corresponding current signal, and output it through the read line for identifying the fingerprint information. In one embodiment, an auxiliary light emitting element 3 is arranged between every two adjacent pixel units 2 in a row direction. The pixel units 2 and the auxiliary light emitting elements 3 located at a same row are connected with a same gate line. The pixel units 2 located at a same column are connected with a same data line. The auxiliary light emitting elements 3 located at a same column are connected with a same data line. The fingerprint recognition elements 41 located at a same row are connected with a same drive line. The fingerprint recognition elements 41 located at a same column are connected with a same read line.

In one embodiment, the driving method of the array substrate includes the following two stages:

In the display stage, the gate lines are controlled to be enabled line by line to output corresponding data voltage signals to the data lines. As such, each of the transparent display elements 21 of the pixel units 2 and the auxiliary light emitting elements 3 emit light at the same time to realize the display of the image. In this stage, no driving signals are written into drive lines, that is, the fingerprint recognition elements 41 do not operate.

In the fingerprint recognition stage, the drive lines are controlled to be enabled line by line to control the fingerprint recognition elements 41 in the fingerprint recognition layer 4 to operate. The fingerprint recognition elements 41 receive the light emitted by the auxiliary light emitting elements 3 and reflected by the touch control body, and convert the received light into corresponding current signals to be output by the read line to identify the fingerprint information. The transparent display elements in this stage do or do not operate as long as the fingerprint recognition elements 41 can receive the light emitted by the auxiliary light emitting elements 3 and reflected by the touch control body, and convert the received light into corresponding current signals to be outputted by the read lines to identify fingerprint information.

In the array substrate of the embodiment, the display elements in the pixel units 2 are transparent display elements 21. As such, in the fingerprint recognition stage, the fingerprint recognition elements 41 are turned on. The light emitted by the auxiliary light emitting elements 3 located among the pixel units 2 and reflected by the touch control body 10 can pass through the transparent display elements 21 to irradiate the fingerprint recognition elements 41. Since the amount of light reflected by the valleys and the ridges of the touch control body 10 is different, the amount of light received by the corresponding fingerprint recognition elements 41 is different and the amount of photocurrents generated by the corresponding fingerprint recognition elements 41 is different. As a result, the fingerprint recognition is realized. Meanwhile, the fingerprint recognition layer 4 in the array substrate of the embodiment is located at a side of the dielectric layer 1 opposite from the pixel units 2. In other words, the aperture ratio of the pixel units is not affected. Therefore, each fingerprint recognition element 41 in the fingerprint recognition layer 4 of the present embodiments can be manufactured to have a larger area than the existing fingerprint recognition element 41. As such, the light absorption area is increased and the generated photocurrent becomes larger, thereby increasing accurateness of the fingerprint detection and recognition.

Embodiment 3

Figure 4:
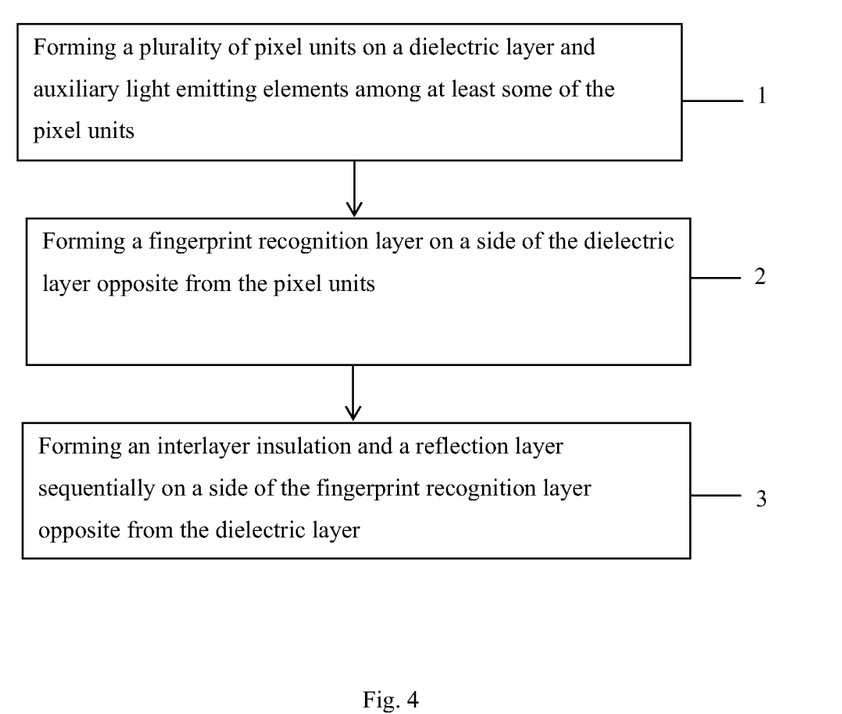
FIG. 4 is a flow chart of a method of preparing an array substrate according to an embodiment of the present disclosure.

As shown in FIG. 4, a method of fabricating an array substrate is provided according to one embodiment of the present disclosure. The fabrication method can be used for preparing the array substrate in the first embodiment, and specifically includes the following steps:

In step 1, a plurality of pixel units 2 are formed on a dielectric layer 1 and auxiliary light emitting elements 3 are formed among at least some of the pixel units 2.

In one embodiment, the dielectric layer 1 is a glass base. Each of the pixel units 2 includes a plurality of transparent display elements 21. Each of the plurality of transparent display elements 21 in a pixel unit emits a light of a different color. The auxiliary light emitting element 3 may be a white organic electroluminescent element emitting white light. Of course, the auxiliary light emitting elements may also be elements emitting light of other colors.

In one embodiment, the dielectric layer 1 is made of a glass base. Each pixel unit 2 includes electroluminescent elements emitting lights of three different colors, which are red, green, and blue. The auxiliary light emitting elements 3 are white electroluminescent elements emitting white light. The method of manufacturing the array substrate may include the following steps:

Step 1 may specifically include the following steps:

In step S11, a pattern of first electrodes of the electroluminescent elements emitting lights of three different colors, red, green, and blue respectively is formed on the glass base by a patterning process. The first electrodes of the electroluminescent elements emitting three different colors of red, green are transparent electrodes. A pattern of first electrodes of the white electroluminescent elements emitting white light is formed through another patterning process. The first electrodes of the white electroluminescent elements emitting white light are reflecting electrodes. The order of these two patterning processes is not limited.

In step S12, after the above steps are completed, a pixel defining layer is formed on the glass base. Accommodating spaces are formed by etching at positions corresponding to the first electrodes.

In step S13, after the above steps are completed, corresponding light emitting materials are formed in the accommodating spaces by an ink jet printing method on the glass base. That is, red, green, blue and white light emitting materials are printed at positions corresponding to the first electrodes of the electroluminescent elements emitting different colors of red, green, and blue, and white respectively by an ink-jet method.

In step S14, after the above steps are completed, a pattern of second electrodes of the electroluminescent elements emitting different colors of red, green, blue, and white is formed on the glass base. The second electrodes of the four electroluminescent elements may be of an integrated structure.

In step 2, a fingerprint recognition layer 4 is formed on a side of the dielectric layer 1 opposite from the pixel units 2.

The fingerprint recognition layer 4 includes a plurality of fingerprint recognition elements 41. The fingerprint recognition elements 41 are used for receiving the light emitted by the auxiliary light emitting elements 3 and reflected by the touch control body 10 in the fingerprint recognition stage so that the fingerprint information is identified. The fingerprint recognition elements 41 may be composed of a thin film transistor and a photodiode. In order to carry out fingerprint recognition more accurately, in one embodiment, the fingerprint recognition elements 41 are formed at positions corresponding to the pixel units 2 in a one-to-one correspondence mode. The orthographic projections of the auxiliary light emitting elements 3 and the fingerprint recognition elements 41 on the dielectric layer 1 do not overlap.

In one embodiment, the step 2 can specifically include the following steps:

In step S1, the structure of the thin film transistors in the fingerprint recognition elements 41 is formed on a side of the dielectric layer 1 opposite from the pixel units 2 at positions corresponding to the pixel units 2 respectively.

In step S2, after the structure of the thin film transistors is formed; the structure of the photodiodes is formed.

The sequence of the first step S1 and the second step S2 can be interchanged.

In one embodiment, in order to improve light utilization rate of the array substrate, the method of fabricating the array substrate may further include the following steps:

In step 3, an interlayer insulation 6 and a reflection layer 5 are formed sequentially on a side of the fingerprint recognition layer 4 opposite from the dielectric layer 1. As such, in the display stage, light emitted by the transparent display elements 21 in the pixel units 2 can pass through the fingerprint recognition layer 4 to perpendicularly irradiate the reflection layer 5, and then be reflected out by the reflection layer 5 to realize the display. As such, loss of the light is prevented and the display effect is improved. Furthermore, the fingerprint recognition layer 4 and the reflection layer 5 are insulated from each other, thereby preventing short-circuiting of the fingerprint recognition layer 4 and the reflection layer 5.

In the array substrate of the embodiment, the display elements in the pixel units 2 are transparent display elements 21. As such, in the fingerprint recognition stage, the fingerprint recognition elements 41 are turned on. The light emitted by the auxiliary light emitting elements 3 located between the pixel units 2 and reflected by the touch control body 10 can pass through the transparent display elements 21 to irradiate the fingerprint recognition elements 41. Since the amount of light reflected by the valleys and the ridges of the touch control body 10 is different, the amount of light received by the corresponding fingerprint recognition elements 41 is different and the amount of photocurrents generated by the corresponding fingerprint recognition elements 41 is different. As a result, the fingerprint recognition is realized. Meanwhile, the fingerprint recognition layer 4 in the array substrate of the embodiment is located at a side of the dielectric layer 1 opposite from the pixel units 2. In other words, the aperture ratio of the pixel units is not affected. Therefore, each fingerprint recognition element 41 in the fingerprint recognition layer 4 of the present embodiments can be manufactured to have a larger area than the existing fingerprint recognition element 41. As such, the light absorption area is increased and the generated photocurrent becomes larger, thereby increasing accurateness of the fingerprint detection and recognition.

Embodiment 4

A display apparatus is provided according to one embodiment of the present disclosure. The display apparatus includes the array substrate of the Embodiment 1.

In this embodiment, the display apparatus may include an OLED panel, a mobile phone, a tablet computer, a display, a notebook computer, a digital photo frame, a navigator, or other products with display functions or parts.

Since an OLED substrate as mentioned above is included, the display apparatus of the embodiment can realize full-screen fingerprint recognition.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

DESCRIPTION OF SYMBOLS IN THE DRAWINGS

1: dielectric layer;
2: pixel unit;
21: transparent display element;
3: auxiliary light emitting element;
4: fingerprint recognition layer;
41: fingerprint recognition element;
5: reflection layer;
6: interlayer insulating layer; and
10: touch control body.

What is claimed is:

1. An array substrate, comprising:
   a dielectric layer;
   a plurality of pixel units on the dielectric layer, each of the pixel units comprising transparent display elements;
   auxiliary light emitting elements among at least some of the transparent display elements; and
   a fingerprint recognition layer on a side of the dielectric layer opposite from the pixel units, the fingerprint recognition layer comprising fingerprint recognition elements, wherein the fingerprint recognition elements are configured to receive light emitted by the auxiliary light emitting elements and reflected by a touch control body to identify fingerprint information.

2. The array substrate according to claim 1, wherein the plurality of pixel units and the auxiliary light emitting elements are on a same side of the dielectric layer.

3. The array substrate according to claim 1, an orthographic projection of at least one of the fingerprint recognition elements on the dielectric layer overlaps an orthographic projection of at least one of the transparent display elements on the dielectric layer.

4. The array substrate according to claim 1, wherein orthographic projections of the auxiliary light emitting elements and the fingerprint recognition elements are present on the dielectric layer and do not overlap.

5. The array substrate according to claim 1, wherein orthographic projections of the auxiliary light emitting elements and the fingerprint recognition elements are present on the dielectric layer and do not completely overlap.

6. The array substrate according to claim 1, wherein each of the auxiliary light emitting elements comprises a first electrode, a light emitting layer, and a second electrode arranged sequentially along a direction away from the dielectric layer, and the first electrode comprises a reflecting material.

7. The array substrate according to claim 1, wherein the plurality of pixel units is arranged in an array mode, and one of the auxiliary light emitting, elements is arranged between every two adjacent pixel units in a row direction.

8. The array substrate according to claim 7, wherein the pixel units and the fingerprint recognition elements are arranged in a one-to-one correspondence mode.

9. The array substrate according to claim 1, wherein each of the auxiliary light emitting elements includes a white electroluminescent element emitting white light.

10. The array substrate according to claim 1, wherein the transparent display elements include electroluminescent elements emitting light of a red, green or blue color respectively or a mixed of any two of red, green and blue colors.

11. The array substrate according to claim 1, wherein each of the fingerprint recognition elements includes a photodiode.

12. The array substrate according to claim 1, wherein the dielectric layer includes a glass base.

13. The array substrate according to claim 1, further comprising an interlayer insulating layer and a reflection layer,
   wherein the reflection layer is on a side of the fingerprint recognition layer opposite from the dielectric layer, and the interlayer insulating layer is between the reflection layer and the fingerprint recognition layer.

14. A method of driving the array substrate according to claim 1, comprising a fingerprint recognition stage, comprising the step of,
controlling the fingerprint recognition elements in the fingerprint recognition layer to receive the light emitted by the auxiliary light emitting elements and reflected by the touch control body to identify fingerprint information.

15. The method according to claim 14, wherein in the fingerprint recognition stage, the transparent display elements are turned off.

16. The method according to claim 14, further comprising a display stage, comprising the step of,
controlling all transparent display elements in the pixel units and the auxiliary light emitting elements to emit light to realize image display.

17. A method of fabricating an array substrate, comprising:
forming a plurality of pixel units on a dielectric layer;
forming auxiliary light emitting elements among at least some of the pixel units; and
forming a fingerprint recognition layer on a side of the dielectric layer opposite from the pixel units,
wherein each of the pixel units comprises transparent display elements, and forming the fingerprint recognition layer comprises forming fingerprint recognition elements, and the fingerprint recognition elements are configured to identify fingerprint information based on received light emitted by the auxiliary light emitting elements and reflected by a touch control body.

18. The method of fabricating the array substrate according to claim 17, further comprising:
forming an interlayer insulating layer and a reflection layer sequentially on a side of the fingerprint recognition layer opposite from the dielectric layer.

19. The method of fabricating the array substrate according to claim 17, wherein orthographic projections of the auxiliary light emitting elements and the fingerprint recognition elements are present on the dielectric layer and do not overlap.

20. A display apparatus comprising the array substrate according to claim 1.

* * * * *

UNITED STATES PATENT AND TRADEMARK OFFICE
CERTIFICATE OF CORRECTION

| | | |
|---|---|---|
| PATENT NO. | : 11,342,399 B2 | Page 1 of 1 |
| APPLICATION NO. | : 16/333725 | |
| DATED | : May 24, 2022 | |
| INVENTOR(S) | : Zhijie Ye et al. | |

It is certified that error appears in the above-identified patent and that said Letters Patent is hereby corrected as shown below:

On the Title Page

Item (71) Applicants:
Please correct the Applicant name "HEFEI BOE OPTOELECTRONICS TECHNOLOGY CO., LTD."
as follows:
"HEFEI XINSHENG OPTOELECTRONICS TECHNOLOGY CO., LTD."

Signed and Sealed this
First Day of November, 2022

Katherine Kelly Vidal
*Director of the United States Patent and Trademark Office*